United States Patent
Iida et al.

(10) Patent No.: US 6,995,096 B2
(45) Date of Patent: Feb. 7, 2006

(54) METHOD FOR FORMING MULTI-LAYER WIRING STRUCTURE

(75) Inventors: Hiroyuki Iida, Kouza-gun (JP); Kazuto Ohbuchi, Kanagawa (JP); Atsushi Matsushita, Kouza-gun (JP); Yoshio Hagiwara, Kita-ku (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/782,084

(22) Filed: Feb. 19, 2004

(65) Prior Publication Data

US 2004/0248396 A1    Dec. 9, 2004

Related U.S. Application Data

(60) Division of application No. 10/291,456, filed on Nov. 7, 2002, now Pat. No. 6,723,633, which is a continuation of application No. 09/024,250, filed on Feb. 17, 1998, now Pat. No. 6,503,825.

(30) Foreign Application Priority Data

Feb. 28, 1997    (JP) .................................... 9-45649

(51) Int. Cl.
H01L 21/31    (2006.01)
(52) U.S. Cl. .................... 438/778; 438/662; 438/624; 438/787
(58) Field of Classification Search ................ 438/622, 438/624, 778, 787, 937, 958
See application file for complete search history.

(56) References Cited

U.S. PATENT DOCUMENTS

| | | |
|---|---|---|
| 4,634,496 A | 1/1987 | Mase et al. |
| 4,673,456 A | 6/1987 | Spencer et al. |
| 5,178,957 A | 1/1993 | Kolpe et al. |
| 5,252,177 A | 10/1993 | Hong et al. |
| 5,310,720 A * | 5/1994 | Shin et al. .................. 438/760 |
| 5,314,724 A | 5/1994 | Tsukune et al. |
| 5,399,237 A | 3/1995 | Keswick et al. |
| 5,472,488 A | 12/1995 | Allman |
| 5,665,643 A * | 9/1997 | Shin ........................... 438/763 |
| 5,665,845 A | 9/1997 | Allman |
| 5,759,906 A | 6/1998 | Lou |

(Continued)

FOREIGN PATENT DOCUMENTS

EP    0 443 760    8/1991

(Continued)

*Primary Examiner*—Amir Zarabian
*Assistant Examiner*—Christy Novacek
(74) *Attorney, Agent, or Firm*—Merchant & Gould P.C.

(57) ABSTRACT

For suppressing decomposition of an organic group (for example, a $CH_3$ group) which is bonded to an Si atom of an organic SOG film for use in a flattening process at the time of an ashing process, there is provided a method comprising the steps of: forming an organic SOG layer directly on a lower wiring layer or on a predetermined film including a hillock protection layer which is formed on the lower wiring layer in advance; forming an upper wiring layer on the organic SOG layer without using an etching back process; forming a via hole through an etching process by using a patterned resist layer provided on the upper wiring layer as a mask; performing an ashing process with a plasma by making ions or radicals which are induced from oxygen gas as a main reactant, under an atmospheric pressure ranging from 0.01 Torr to 30.0 Torr; and filling said via hole with a conductive material so as to electrically connect the lower wiring layer to the upper wiring layer.

1 Claim, 6 Drawing Sheets

U.S. PATENT DOCUMENTS

| | | |
|---|---|---|
| 5,762,697 A | 6/1998 | Sakamoto et al. |
| 5,770,260 A * | 6/1998 | Fukuyama et al. ......... 427/226 |
| 5,858,869 A | 1/1999 | Chen et al. |
| 5,891,234 A | 4/1999 | Koyanagi et al. |
| 5,932,487 A | 8/1999 | Lou et al. |
| 5,989,945 A * | 11/1999 | Yudasaka et al. ........... 438/149 |
| 6,222,269 B1 * | 4/2001 | Usami ........................ 257/758 |
| 6,232,216 B1 * | 5/2001 | Machida et al. ............ 438/624 |

FOREIGN PATENT DOCUMENTS

| | | |
|---|---|---|
| JP | 8-316228 | 11/1996 |
| JP | 9-64037 | 3/1997 |

* cited by examiner (a)

(b)

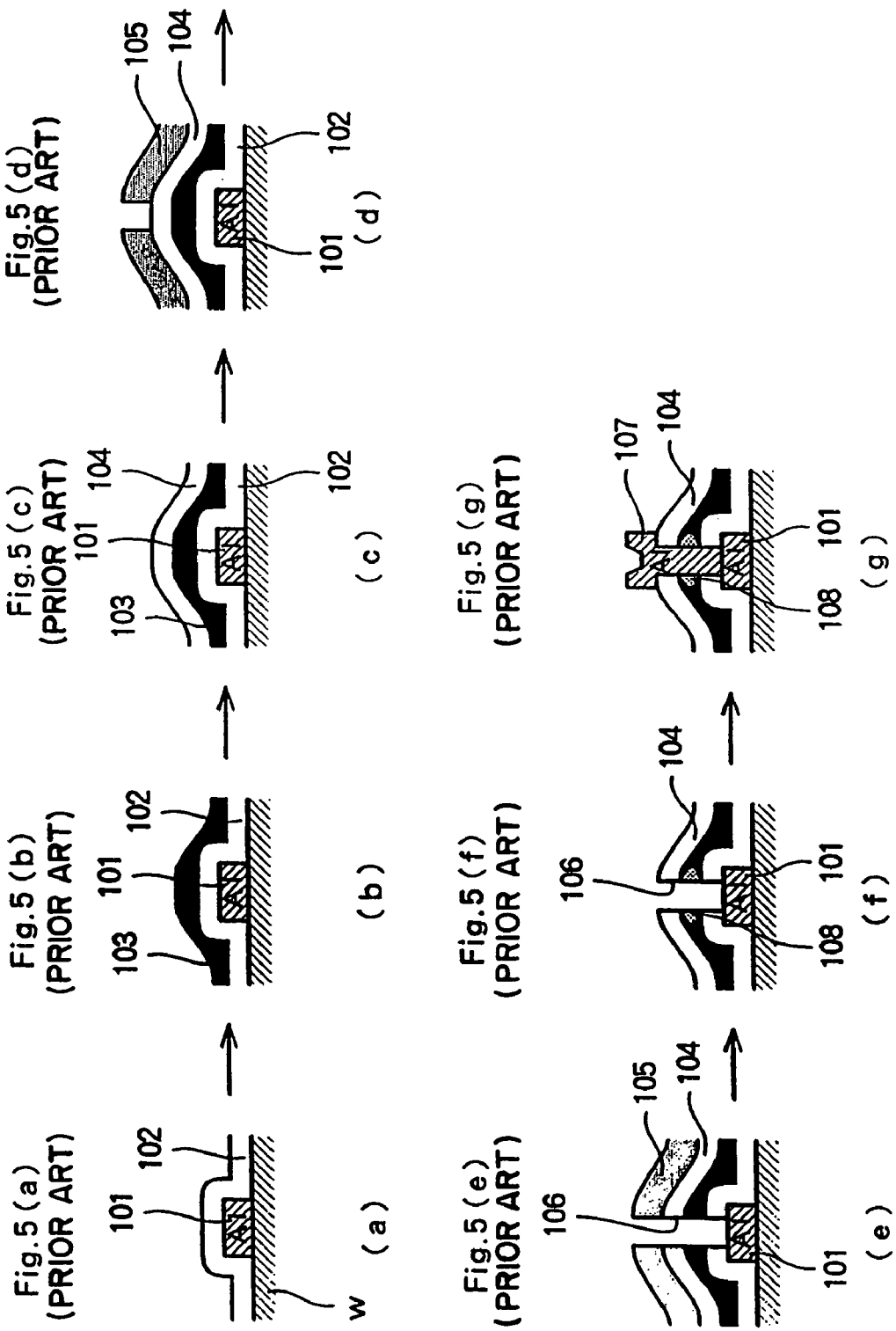

(a)

(b)

(c)

(d)

(e)

(f)

METHOD FOR FORMING MULTI-LAYER WIRING STRUCTURE

This application is a divisional of application Ser. No. 10/291,456, filed Nov. 7, 2002 now U.S. Pat. No. 6,723,633, which is a continuation of application Ser. No. 09/024,250, filed Feb. 17, 1998, now Issued U.S. Pat. No. 6,503,825, which applications are incorporated herein by reference.

BACKGROUND OF THE INVENTION

1. Field of the Invention

The present invention relates to a method for forming a multi-layer wiring structure on a semiconductor wafer or on a glass substrate.

2. Description of Related Art

In general, a device being formed on a semiconductor wafer or on a glass substrate has a multi-layer wiring structure comprising a lower wiring layer and an upper wiring layer which are electrically connected through a so-called via hole.

However, in such a multi-layer wiring structure, when only an insulating film is provided between the upper wiring layer and the lower wiring layer, an unevenness of the lower wiring layer will be present on the surface of the insulating film, and breakage will be caused in the upper wiring layer which is formed on the uneven surface by a CVD method. Therefore, technologies for flattening are normally applied, in which recesses are filled up with SOG (Spin-On-Glass: silicon oxide film which is formed by coating and baking solution of silicon compound). Among those, regarding an inorganic SOG including Si—H chemical bonds, it is disclosed in, for example, Japanese Patent Application No. Hei 8-316,228 (1996).

The SOG, which is disclosed in Japanese Patent Application Publication No. Hei 8-316,228 (1996) is an inorganic SOG including Si—H chemical bonds. Therefore, it has a high dielectric constant in comparison with that of an organic SOG, and easily cracks due to heat.

On the other hand, an organic SOG does not have the same problems that an inorganic SOG has. However, it is easy to cause a defect which is called as a "poisoned via" when a resist film is treated by a so-called ashing process by using oxygen gas. Particularly, in an organic SOG, an organic group (for example, a methyl group ($CH_3$)) is bonded to Si, and the atomic radius of the methyl group is larger than that of a hydrogen group of an inorganic SOG which causes a serious problem.

This problem will be explained by referring to FIG. 5 showing a method for forming a multi-layer wiring structure of the conventional art. First of all, as shown in FIG. 5 (a), after a lower wiring layer 101 is formed on a substrate W, a hillock protection film 102 is formed by a CVD method. As shown in FIG. 5 (b), a SOG film 103 is formed on the hillock protection film 102, and thereafter, as shown in FIG. 5 (c), an upper wiring layer 104 is formed on the SOG film 103. further, a patterned resist layer 105 is provided as shown in FIG. 5 (d), and as shown is FIG. (e), a via hole (or a through hole) 106 is formed by using the patterned resist layer 105 as a mask through an etching process on the hillock protection film 102, the SOG film 103 and the upper wiring layer 104. Next, as shown in FIG. 5 (f), the patterned resist layer 105 is removed by an ashing process. Furthermore, as shown in FIG. 5 (g), conductive material 107 such as aluminum is filled within the via hole 106, thereby electrically connecting between the wiring layers and constructing a multi-layer wiring structure.

In this method, in a case where an organic SOG is used, the organic components thereof are decomposed when the resist layer is treated by an ashing process as shown in FIG. 5 (f), and a product such as water is stored within the films, thereby causing a defect 108 which is called as a "poisoned via".

Therefore, such a method as shown in FIG. 6, in which an organic SOG is used and an etching back process is required, has been employed. Specifically, as shown in FIG. 6 (a), after a lower wiring layer 101 is formed on a substrate W, a hillock protection film 102 is formed by a CVD method, and a SOG film 103 is formed thereon. Next, as shown in FIG. 6 (b), an etching back process is used for removing the organic SOG film 103 with an oxygen plasma etc. by such a predetermined thickness that the organic SOG film 103 is removed to just above the lower wiring layer 101. Thereafter, as shown in FIG. 6 (c), an upper wiring layer 104 is formed, and as shown in FIG. 6 (d), a patterned resist layer 105 is formed over the upper wiring layer 104. As shown in FIG. 6 (e), by conducting an etching process and a subsequent ashing process, a via hole 106 is formed in the hillock protection film 102 and the upper wiring layer 104, and the resist layer is removed. Further, as shown in FIG. 6 (f), conductive material 107 such as aluminum is filled within the via hole 106, thereby electrically connecting between the wiring layers and constructing a multi-layer wiring structure.

By using such an etching back process as shown in FIG. 6, the via hole is formed in an area where the organic SOG film 103 does not exist, therefore, a "poisoned via" will not be generated.

However, in recent years, a further demand for miniaturization (for instance, less than or equal to 0.3 $\mu$m) has been required. If the wiring pattern is miniaturized, the thickness of the organic SOG becomes thick in an area where the wiring pattern is dense, while it becomes thin in an area where the wiring pattern is less dense.

If the organic SOG film under such conditions is etched back, the wiring layer is undesirably removed in an area where the wiring pattern is less dense.

SUMMARY OF THE INVENTION

For solving such disadvantages, in accordance with the present invention, there is provided a method for forming a multi-layer wiring structure, wherein a lower wiring layer and an upper wiring layer are electrically connected through a via hole, comprising the steps of: forming an organic SOG layer directly on said lower wiring layer or on a predetermined film including a hillock protection layer which is formed on said lower wiring layer in advance; forming said upper wiring layer on said organic SOG layer without using an etching back process; forming a via hole through an etching process by using a patterned resist layer provided on said upper wiring layer as a mask; performing an ashing process with a plasma by making ions or radicals which are induced from oxygen gas as a main reactant, under an atmosphere of pressure ranging from 0.01 Torr to 30.0 Torr; and filling said via hole with conductive material so as to electrically connect said lower wiring layer to said upper wiring layer.

By performing an ashing process with a plasma by making ions or radicals which are induced from oxygen gas as a main reactant under a low pressure ranging from 0.01 to 30.0 Torr, preferably, ranging from 0.01 to 1.2 Torr, it is possible to suppress decomposition of an organic group (for example, a $CH_3$ group etc.) which is bonded to an Si atom of the organic SOG film, and thereby prevent a "poisoned via" and so on from being generated during the ashing process. Consequently, according to the present invention, an etching back process is not necessary.

The carbon content of said organic SOG layer is in the range of 5 to 25 atomic weight %, more preferably, between 8 to 20 atomic weight %. The carbon content is used to determine a ratio of an organic group in an organic SOG, in other words, it can be theoretically calculated from a reaction amount of an alkoxysilane compound for preparing a coating liquid of forming an organic SOG, and it is a ratio of the atomic weight of carbon with respect to the total atomic weight of all elements.

If the carbon content is less than the range mentioned above, the organic component is too small to thicken the film, thus, cracks will easily occur, and an inherent advantage of an organic SOG i.e., a low dielectric constant is lost. On the other hand, if the carbon content is too great, a lack of adhesion occurs between an insulating layer which is provided on an upper layer.

For obtaining a film having the carbon content mentioned above, it is preferable to use, for example, a coating liquid containing a compound, which is obtained through hydrolysis and condensation of at least one being selected from alkoxysilane compounds in an organic solvent under existence of an acid catalyst, said alkoxysilane compound being expressed by a general equation, $RnSiIOR^1)_{4-n}$, where R is an alkyl group having a carbon number of 1 to 4 or an aryl group, $R^1$ is an alkyl group having a carbon number of 1 to 4, and n is an integer of 1 or 2.

The following are examples of the alkoxysilane compound which is expressed by the above general equation:

(a) in a case where n=1, monoalkyltrialkoxysilane including: monomethyltrimethoxysilane, monomethyltriethoxysilane, monomethyltripropoxysilane, monoethyltrimethoxysilane, monoethyltriethoxysilane, monoethyltriprooxysilane, monopropyltrimethoxysilane, monopropyltriethoxysilane, etc., and monophenyltrialkoxysilane including: monophenyltrimethoxysilane, monophenyltriethoxysilane, etc.

(b) in a case where n=2, dialkyhldialkoxylsilane including: dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane, dipropyldipropoxysilane, etc., and diphenyldialkoxysilane including: diphenyldimethoxysilane, diphenyldiethoxysilane, etc. It is necessary to use at leas tone kind from (a) and (b).

If desired, as another compounds which can be condensed with (a) and (b), it is also effective to use a case where n=0 of the compound which is expressed by the above general equation, namely, (c) tetraalkoxysilane: including tetramethoxysilane, tetraethoxysilane, tetrapropoxysilane, tetrabutoxysilane, etc.

Among those, the compounds preferable from a practical view point are tetramethoxysilane, tetraethoxysilane, monomethyltrimethoxysilane, monomethyltriethoxysilane, dimethyldimethoxysilane, and dimethyldiethoxysilane.

It is possible to use only one of those alkoxylsilane compounds, or two or more in combination.

Specifically, combination of (a) and (c), combination of (a), (b) and (c), and (a) alone are preferable.

Regarding the mol ratio of reaction in the case where (a) and (c) are combined, 1 mol of (c) tetraalkoxyailane is reacted with 0.5–4.0 mol, more preferably 1.0–2.0 mol of (a) monoalkyltrialkoxysilane, and coating liquid containing a product obtained through hydrolysis and condensation thereof is used.

In the case where (a), (b) and (c) are combined, 1 mol of (b) dialkyldialkoxysilane is reacted with 0.5–4.0 mol, more preferably 1.0–3.0 mol of (c) tetraalkoxysilane and 0.5–4.0 mol, more preferably 0.5–3.0 mol of (a) monoalkyltrialkoxysilane, and a coating liquid containing a product obtained through hydrolysis and condensation thereof is used.

Further, in the case of (a) monoalkyltrialkoxysilane alone, product obtained through hydrolysis and condensation easily has a ladder type structure, and such a ladder type product is preferable to form a fine film.

The hydrolysate may be one which is completely hydrolyzed or which is partially hydrolyzed. The degree of the hydrolysis can be adjusted by an amount of water to be added, and the amount of water is adjusted appropriately depending on the characteristics of the organic SOG layer to be formed. In general, it is desired that water is reacted at a ratio of 1.0–10.0 mol, more preferably at a ratio of 1.5–8.0 mol with respect to 1 mol of alkoxysilane which is used to prepare the coating liquid. If the ratio of water is too much lower than this range, the degree of hydrolysis becomes low and it becomes difficult to form a film. If the ratio of water is too much higher than this range, gelation easily occurs, which causes bad stability in preservation.

Further, as for the acid catalyst, each of organic acid and inorganic acid, which have been commonly used in the conventional art, can be used. As the organic acid, organic carboxylic acid such as acetic acid, propionic acid, butyric acid can be used. As the inorganic acid, hydrochloric acid, nitric acid, sulfuric acid, phosphoric acid, etc. can be used.

In this case, the acid catalyst is added into the coating liquid in such a manner that the concentration of acid lies within a range of 1–1,000 ppm, more preferably 5–500 ppm, or is added in a state of an acid aqueous solution obtained by mixing acid and water to be added, and thereby hydrolysis is performed.

The hydrolysis is normally completed within 5–100 hours. Further, the reaction can be completed in a short reaction time by adding an acid catalyst aqueous solution into an organic solvent containing an alkoxysilane compound so as to be reacted at a temperature heated from room temperature up to 80° C. The alkoxysilane compound which is hydrolyzed in this manner causes a condensation reaction, and thereby an ability to form a film is obtained.

As the organic solvent, various organic solvents which have been commonly used in the conventional art, can be used. Examples of such solvents are: monohydric alcohol, including methyl alcohol, ethyl alcohol, propyl alcohol, butyl alcohol, etc.; polyhydric alcohol, including ethylene glycol, diethylene glycol, propylene glycol, etc.; a polyhydric alcohol derivative, including ethylene glycol monomethyl ether, ethylene glycol monoethyl ether, ethylene glycol monopropyl ether, ethylene glycol monobutyl ether, propylane glycol monomethyl ether, propylane glycol monoethyl ether, propylane glycol monpropyl ether, propylane glycol monobutyl ether, ethylene glycol monomethyl ether acetate, ethylene glycol monoethyl ether acetate, propylane glycol monomethyl ether acetate, propylane glycol monoethyl ether acetate, etc.; and a fatty acid, including an acetic acid, a propionic acid, etc. These organic solvents can be used not only individually, but also used in combination of two or more kinds thereof. As for the amount of the organic solvent, the organic solvent is used at a ratio of 10–30 mol with respect to 1 mol of akoxysilane.

Further, in accordance with the method for forming a multi-layer wiring structure of the present invention, good results can be obtained with respect to SOG film which is formed from a coating liquid including polysilazane.

It is preferable that such polysilazane has a weight-average molecular weight (Mw) in polystyrene conversion of 1500–5000 more preferably 1700–3000, which is measured by gel permeation chromatography (GPC). Furthermore, it is preferable that the dispersion degree (Mw/Mn) lies within a range from 1 to 4, since it shows good stability for preservation.

In particular, since polysilazane has an active organic group (hydrogen which is bonded to a nitrogen atom and a silicon atom) within, bridge formation easily occurs and thereby an increase of viscosity or gelation is caused. For preventing this, it is preferable to use polysilazane in which a part of the active hydrogen is replaced with a trimethylsilil group by processing with hexamethyl disilazane, since it has good stability for preservation.

As an organic solvent for dissolving polysilazane, from view points of fire safety, dryness and stability for preservation, it is preferable to use a solvent having low hygroscopicity. Examples of such a solvent are: dialkylether of an alkyl group having a carbon number of more than 4, xylene, cyclohexane, dimethylcyclohexane, ethylcyclohexane, p-menthane, decalin, 2,2,5-trimethylhexane, dipentene, decane, isononane, octane, etc. Among these, dialkylether of an alkyl group having a carbon number of more than 4 is preferable, and in particular, dibutylether is preferable. These organic solvents can be used not only individually, but also used in combination of two or more kinds thereof.

The coating liquid for forming an organic SOG film or the coating liquid containing polysilazane, in accordance with the present invention, is preferable to have the above-mentioned hydrolysate of alkoxysilane or polysilazane at a concentration of 5–40 weight %, more preferably 10–25 weight % with respect to solids, so as to achieve stability for preservation and to thicken a film to be formed.

Further, in the method for forming an organic SOG film, the above-mentioned coating liquid is applied onto a substrate such as a semiconductor substrate, a glass substrate, a metal substrate, a ceramic substrate by means of a so-called spinner method, a roll coating method, an immersion coating method, a spray method, a screen printing method, a brush painting method, etc., it is dried to scatter or evaporate the solvent therein, and thereby a coating film is formed. Then it is baked at a temperature of 250–500° C., and thereby an organic SOG film is formed.

Also, in the method for forming a SOG film which is formed from a coating liquid containing polysilazane, the same steps are employed.

BRIEF DESCRIPTION OF DRAWINGS

FIG. 5 (a) through FIG. 5 (g) show processes for flattening in accordance with the conventional art.

DESCRIPTION OF THE PREFERRED EMBODIMENTS

Hereinafter, detailed explanations of the embodiments according to the present invention will be given by referring to the attached drawings.

EXAMPLE 1

Preparation of Coating Liquid 246 g (1.62 mol) of tetramethoxysilane and 220 g (1.62 mol) of monomethyltrimethoxysilane are dissolved into 635 g (5.38 mol) of propyleneglycolmonopropylethyer, and mixed. Next, a mixture of 194 g (10.78 mol) of deionized water and 24 ppm of nitric acid is added thereinto and stirred slowly for about 5 hours. Thereafter, it is left standing still for 5 days at room temperature so as to obtain a solution having a solids concentration of 15 weight %.

This solution is applied onto a hillock protection film covering a lower wiring layer formed on the substrate, thereby forming an organic SOG film. The carbon content in the organic SOG film which is obtained by the following equation is 9.4 atomic weight %:

$$C/(CH_3SiO_{3/2}+SiO_2) \times 100$$

Then, an upper wiring layer is formed on this organic SOG film without performing an etching back process, and a via hole is formed with an etching process by using a patterned resist layer as a mask. Thereafter, with use of a plasma ashing apparatus of a single wafer down-stream type, an ashing process is performed so as to remove the resist layer, by making ions or radicals which are induced from oxygen gas as a main reactant, under an atmospheric pressure of 1.2 Torr. Thereafter, the via hole is filled with a conductive material so as to electrically connect the lower wiring layer to the upper wiring layer.

Figure 1A:
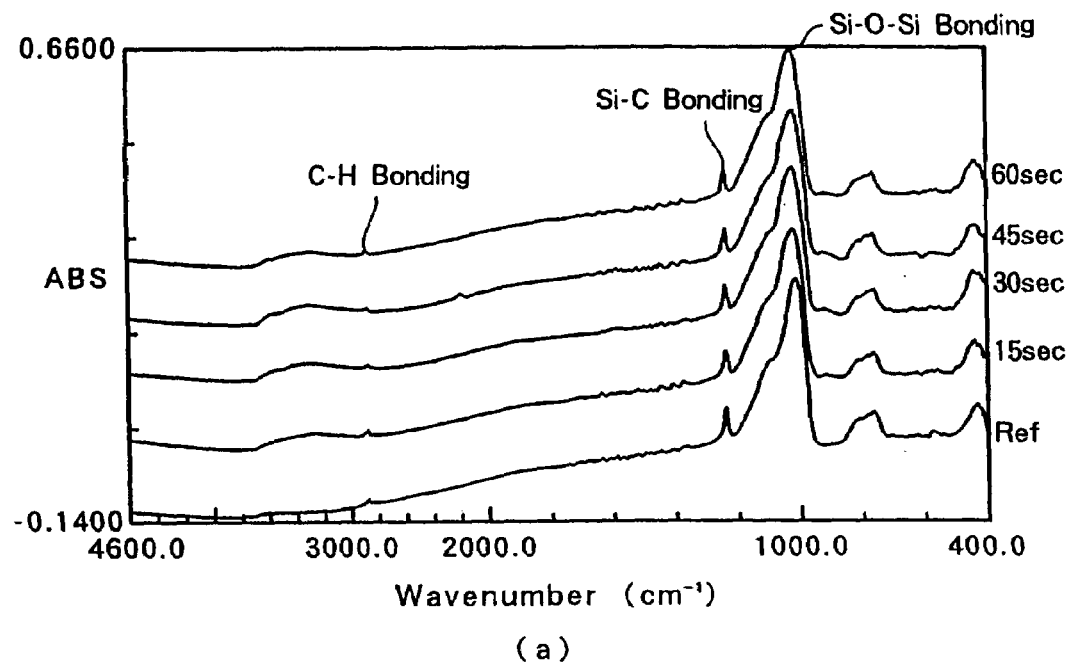
FIG. 1 (a) shows a graph of an infrared absorption spectrum in a case where an ashing process is performed for a predetermined time under an atmospheric pressure of 1.2 Torr by using a plasma ashing apparatus of a single wafer down-stream type, and FIG. 1 (b) shows a graph of an infrared absorption spectrum in a case where an ashing process is performed for a time of 30 seconds under a predetermined atmospheric pressure by using the same apparatus.
Figure 1B:
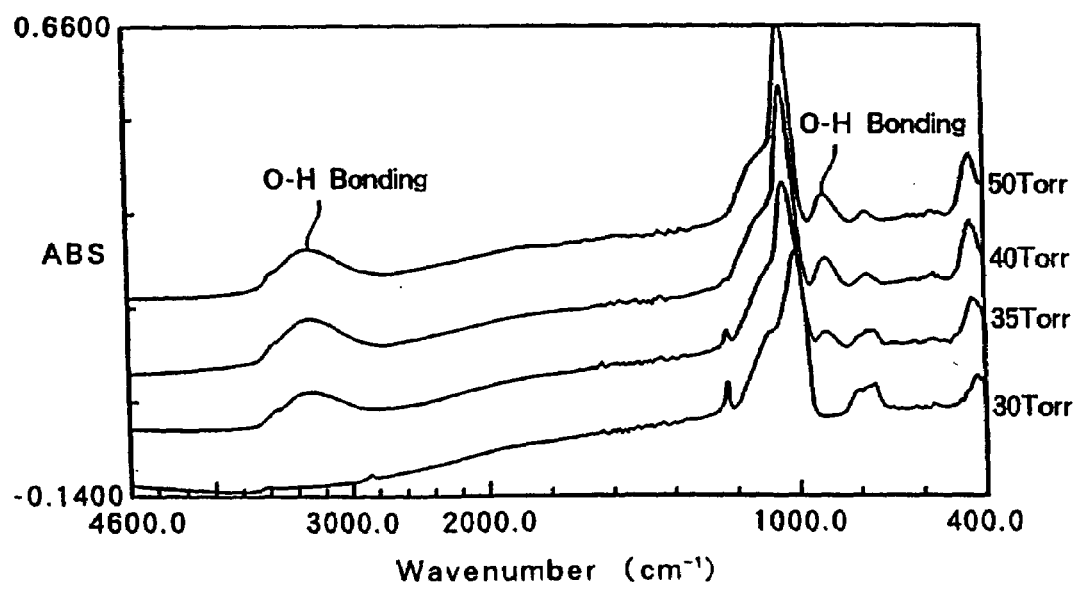

FIG. 1 (a) shows the infrared absorption spectrums which are obtained by setting the time of the above-mentioned ashing process to 60 seconds, 45 seconds, 30 seconds, 15 seconds and no process, respectively. From this drawing, it is apparent that Si—C bonds are not broken in the case of the present invention.

On the other hand, FIG. 1 (b) shows the infrared absorption spectrums which are obtained by setting the pressure of the above-mentioned ashing process to 50 Torr, 40 Torr, 35 Torr and 30 Torr, respectively, while the time is fixed to 30 seconds. From this drawing, it is apparent that the Si—C bonds are broken and OH bonds are generated if the pressure of the ashing process is high.

EXAMPLE 2

Preparation of Coating Liquid 4 g (2 mol) of tetramethoxysilane, 272.4 g (2 mol) of monomethyltrimethoxysilane and 120.2 g (1 mol) of dimethyldimethoxysilane are dissolved into 608.6 g (8.21 mol) of isopropylalcohol, and mixed. Next, a mixture of 288.0 g (16 mol) of deionized water and 40 ppm of nitric acid is added thereinto and stirred slowly for about 5 hours. Thereafter, it is left standing still for 5 days at room temperature so as to obtain a solution having a solids concentration of 16 weight %.

This solution mentioned above is applied onto a hillock protection film covering a lower wiring layer formed on the substrate, thereby forming an organic SOG film. The carbon content in the organic SOG film which is obtained by the following equation is 14.6 atomic weight %:

$$3C/[(CH_3)_2SiO_{2/2}+CH_3Si_{3/2}+SiO_2]\times 100$$

Then, an upper wiring layer is formed on this organic SOG film without conducting an etching back process, and a via hole is formed with an etching process by using a patterned resist layer as a mask. Thereafter, using a plasma ashing apparatus of a single wafer down-stream type, an ashing process is conducted so as to remove the resist layer, by making ions or radicals which are induced from oxygen gas as a main reactant, under an atmospheric pressure of 1.0 Torr. Thereafter, the via hole is filled with a conductive material so as to electrically connect the lower wiring layer to the upper wiring layer.

Figure 2A:
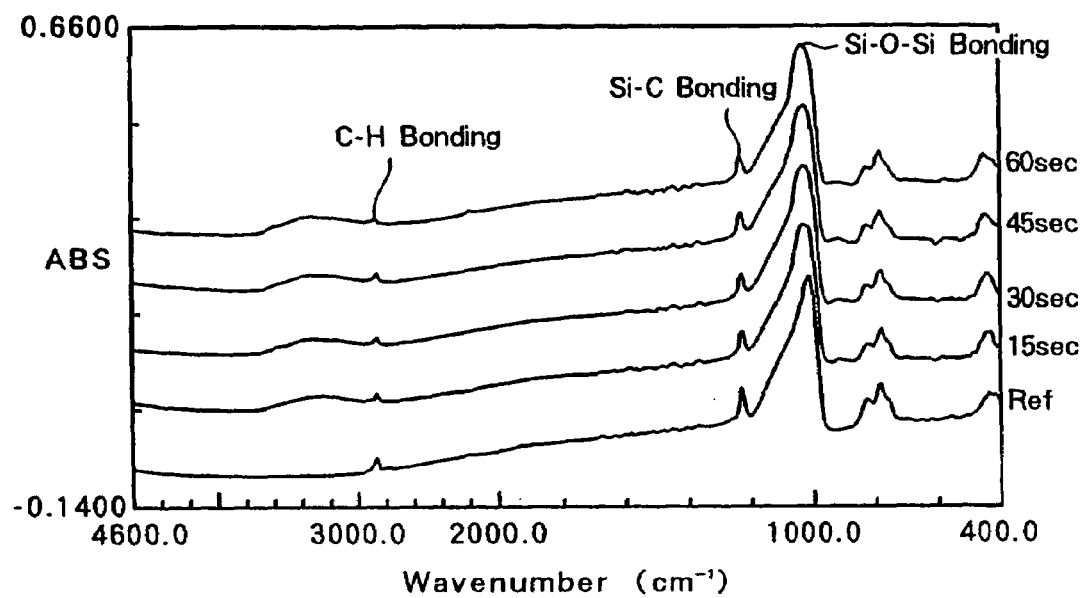
FIG. 2 (a) shows a graph of an infrared absorption spectrum in a case where an ashing process is performed for a predetermined time under an atmospheric pressure of 1.0 Torr by using a plasma ashing apparatus of a single wafer down-stream type, and FIG. 2 (b) shows a graph of an infrared absorption spectrum in a case where an ashing process is performed for a time of 30 seconds under a predetermined atmospheric pressure by using the same apparatus.
Figure 2B:
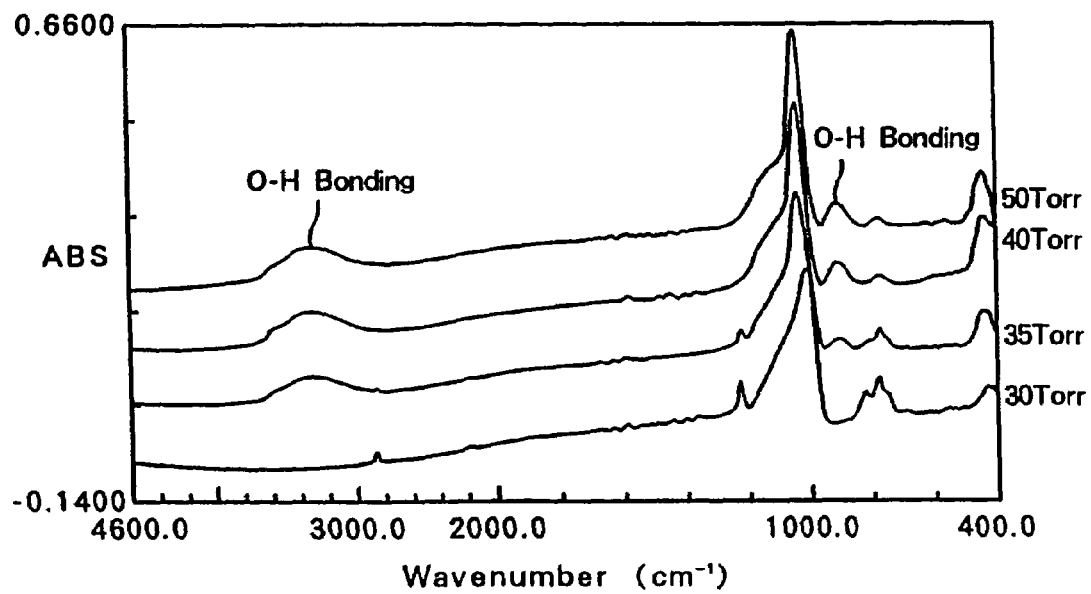

FIG. 2 (a) shows the infrared absorption spectrums which are obtained by setting the time of the above-mentioned ashing process to 60 seconds, 45 seconds, 30 seconds, 15 seconds and no processing, respectively. From this drawing, it is apparent that the Si—C bonds are not broken, in the case of the present invention.

On the other hand, FIG. 2 (b) shows the infrared absorption spectrums which are obtained by setting the pressure of the above-mentioned ashing process to 50 Torr, 40 Torr, 35 Torr and 30 Torr, respectively, while the time is fixed to 30 seconds. From this drawing, it is apparent that the Si—C bonds are broken and OH bonds are generated if the pressure of the ashing process becomes high.

EXAMPLE 3

Preparation of Coating Liquid

A ladder type product obtained from monomethyltriethoxysilane through hydrolysis and condensation under existence of an acid catalyst is dissolved into ethanol, and a solution having a solids concentration of 10 weight % is obtained. This solution is applied onto a hillock protection film covering a lower wiring layer on the substrate, thereby forming an organic SOG film. The carbon content in the organic SOG film which is obtained by the following equation is 17.9 atomic weight %:

$$C/[(CH_3)SiO_{3/2}]\times 100$$

Then, an upper wiring layer is formed on this organic SOG film without conducting an etching back process, and a via hole is formed with an etching process by using a patterned resist layer as a mask. Thereafter, using a plasma ashing apparatus of a single wafer down-stream type, an ashing process is conducted so as to remove the resist layer, by making ions or radicals which are induced from oxygen gas as a main reactant, under an atmospheric pressure of 0.8 Torr. Thereafter, the via hole is filled with a conductive material so as to electrically connect the lower wiring layer to the upper wiring layer.

Figure 3A:
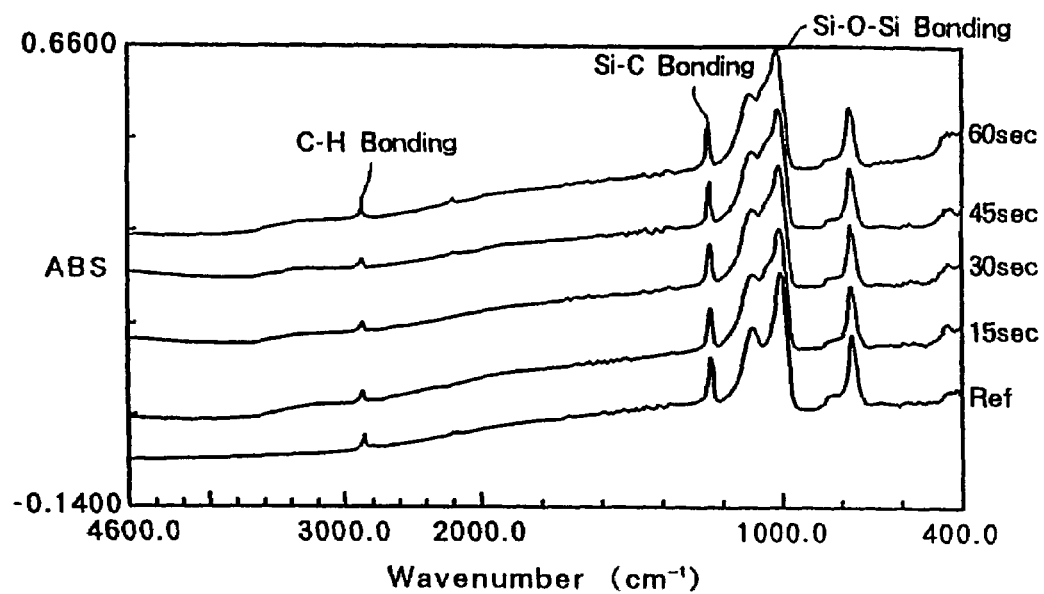
FIG. 3 (a) shows a graph of an infrared absorption spectrum in a case where an ashing process is performed for a predetermined time under an atmospheric pressure of 0.8 Torr by using a plasma ashing apparatus of a single wafer down-stream type, and FIG. 3 (b) shows a graph of an infrared absorption spectrum in a case where an ashing process is performed for a time of 20 seconds under a predetermined atmospheric pressure by using the same apparatus.
Figure 3B:
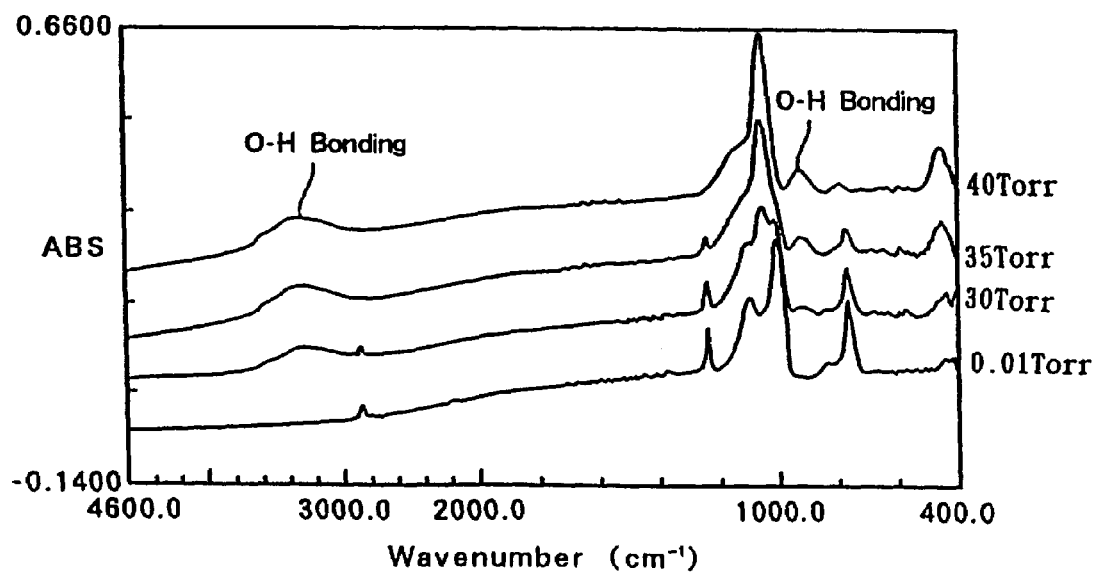

FIG. 3 (a) shows the infrared absorption spectrums which are obtained by setting the time of the above-mentioned ashing process to 60 seconds, 45 seconds, 30 seconds, 15 seconds and no process, respectively. From this drawing, it is apparent that the Si—C bonds are not broken in the case of the present invention.

On the other hand, FIG. 3 (b) shows the infrared absorption spectrums which are obtained by setting the pressure of the above-mentioned ashing process to 40 Torr, 35 Torr, 30 Torr and 0.01 Torr, respectively, while the time is fixed to 20 seconds. From this drawing, it is apparent that the Si—C bonds are broken and OH bonds are generated if the pressure of the ashing process becomes high.

EXAMPLE 4

Preparation of Coating Liquid

A product (weight-average molecular weight=2200, number-average molecular weight=950, dispersion=2.3) which is obtained by adding and reacting hexamethyldisilazane with polysilazane is dissolved into dibutylether, and a solution having a solids concentration of 20 weight % is obtained, in which the polysilazane is composed from ingredients such as dichlorosilane and ammonia according to a common method. This solution is applied onto a hillock protection film covering a lower wiring layer on the substrate, thereby forming a SOG film.

Then, an upper wiring layer is formed on this SOG film without conducting an etching back process, and a via hole is formed with an etching process by using a patterned resist layer as a mask. Thereafter, using a plasma ashing apparatus of a single wafer down-stream type, an ashing process is conducted so as to remove the resist layer, by making ions or radicals which are induced from oxygen gas as a main reactant, for 30 seconds, under an atmospheric pressure of 0.01 Torr. Thereafter, the via hole is filled with a conductive material so as to electrically connect the lower wiring layer to the upper wiring layer.

Figure 4A:
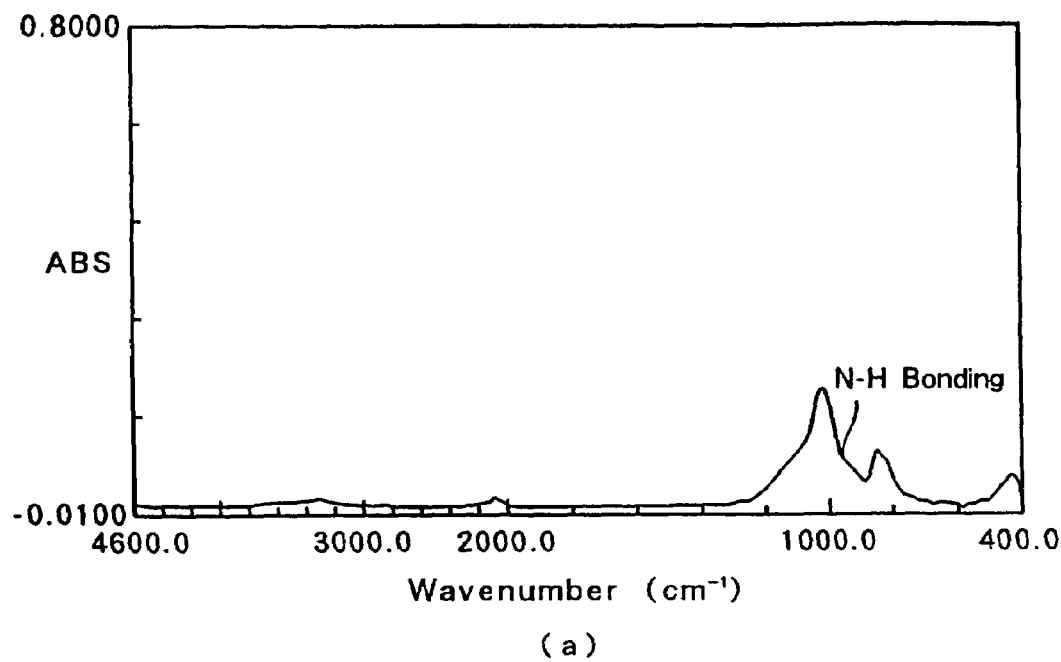
FIG. 4 (a) shows a graph of an infrared absorption spectrum in a case where an ashing process is performed for a predetermined time under an atmospheric pressure of 0.01 Torr by using a plasma ashing apparatus of a single wafer down-stream type, and FIG. 4 (b) shows a graph of an infrared absorption spectrum in a case where an ashing process is performed for a time of 30 seconds under a predetermined atmospheric pressure by using the same apparatus.
Figure 4B:
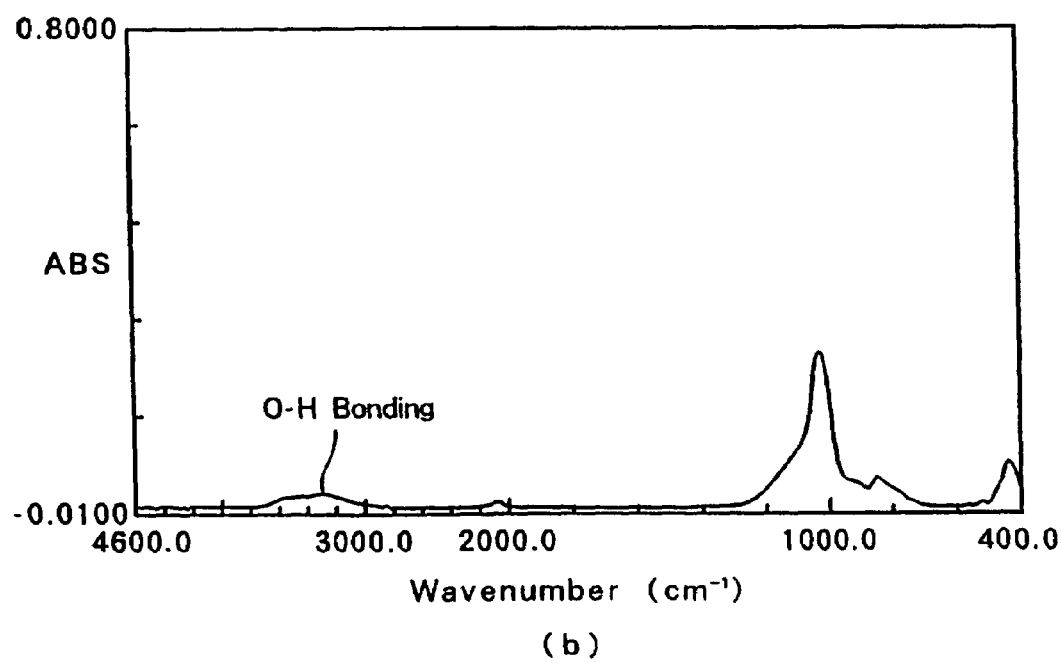
Figure 6A:
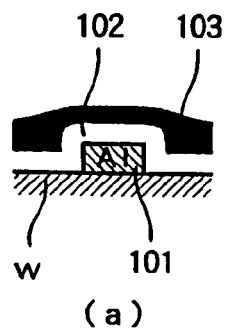
FIG. 6 (a) trough FIG. 6 (f) show processes of etching back in accordance with the conventional art.
Figure 6B:
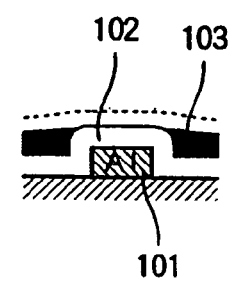
Figure 6C:
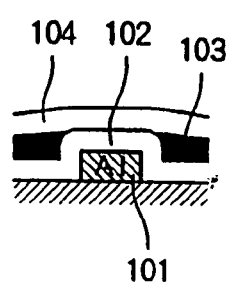
Figure 6D:
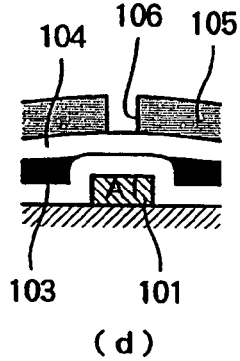
Figure 6E:
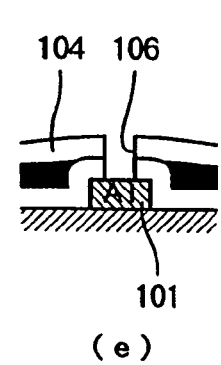
Figure 6F:
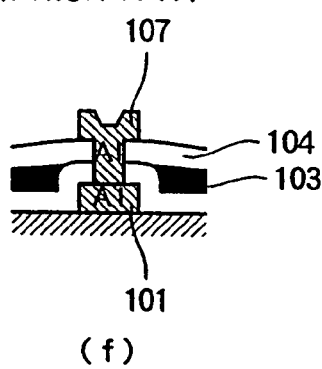

FIG. 4 (a) shows the infrared absorption spectrum after the ashing process is conducted. From this drawing, it is apparent that the N—HG bonds are not broken in the case of the present invention.

On the other hand, FIG. 4 (b) shows the infrared absorption spectrum which is obtained by setting the atmospheric pressure of the above-mentioned ashing process to 35 Torr. From this drawing, it is apparent that the N—H bonds are broken and OH bonds are generated if the pressure of the ashing process becomes high.

As is fully explained in the above, in accordance with the present invention, decomposition of an organic group (for example, a methyl group ($CH_3$) etc.) bonded to an Si atom of the organic SOG film can be suppressed, and as a result, the phenomenon known as a "poisoned via" will not occur during the ashing process of the resist layer. Consequently, the etching back process can be omitted, and thereby the processes can be simplified. Further, the same effect can be achieved with respect to the SOG film which is formed from a coating liquid containing polysilazane.

Moreover, since the etching back process can be omitted, there is no possibility that the lower wiring layer is removed during the etching back process, and thereby it becomes possible to form a further miniaturized pattern.

What is claimed is:

1. A method for forming multi-layer wiring structure, wherein a lower wiring layer and an upper wiring layer are electrically connected through a via hole, comprising following steps:

forming a SOG layer from a coating liquid containing 5–40 wt. % polysilazane having a weight average molecular weight in polystyrene conversion of 1500 to 5000 wherein at least part of the active hydrogen of said polysilazane is replaced with a trimethylsilil group, directly on said lower wiring layer or on a predetermined film including a hillock protection layer which is formed on said lower wiring layer in advance;

forming said upper wiring layer on said SOG layer without using an etching back process;

forming a via hole through an etching process by using a patterned resist layer provided on said upper wiring layer as a mask;

conducting an ashing process to remove said patterned resist layer with a plasma by making ions or radicals which are induced from oxygen gas as a main reactant, under an atmospheric pressure of about 0.01 Torr; and filling said via hole with a conductive material so as to electrically connect said lower wiring layer to said upper wiring layer.

* * * * *